US006211690B1

(12) United States Patent
Fjelstad

(10) Patent No.: US 6,211,690 B1
(45) Date of Patent: Apr. 3, 2001

(54) APPARATUS FOR ELECTRICALLY TESTING BARE PRINTED CIRCUITS

(75) Inventor: Joseph Fjelstad, Sunnyvale, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/170,904

(22) Filed: Oct. 13, 1998

Related U.S. Application Data

(60) Provisional application No. 60/061,861, filed on Oct. 15, 1997.

(51) Int. Cl.[7] .................................................... G01R 1/073
(52) U.S. Cl. .......................................... 324/761; 324/762
(58) Field of Search .................................. 324/754, 762, 324/755, 758, 761

(56) References Cited

U.S. PATENT DOCUMENTS

| 3,654,585 | * | 4/1972 | Wickersham | 439/65 |
| 4,551,673 | * | 11/1985 | Barth et al. | 324/754 |
| 4,649,338 | * | 3/1987 | Dugan | 324/758 |
| 5,216,358 | * | 6/1993 | Vaucher | 324/754 |
| 5,632,631 | | 5/1997 | Fjelstand et al. | 439/66 |
| 5,811,982 | * | 9/1998 | Beaman et al. | 324/762 |

* cited by examiner

*Primary Examiner*—Ernest Karlsen
(74) *Attorney, Agent, or Firm*—Lerner, David, Littenberg, Krumholz & Mentlik, LLP

(57) ABSTRACT

A testing fixture for microelectronic elements is in the nature of an interposer which is operative for receiving a plurality of test probes. The interposer enables the simultaneous testing of contacts on the microelectronic element which are arranged in both high contact pitch density areas and normal contact pitch density areas. The contacts on the microelectronic element within the high contact pitch density areas are accessed by conductive leads on the interposer having rigid portions arranged in a corresponding high contact pitch density.

37 Claims, 3 Drawing Sheets

APPARATUS FOR ELECTRICALLY TESTING BARE PRINTED CIRCUITS

The present application claims the benefit of U.S. Provisional Patent Application No. 60/061,861 filed on Oct. 15, 1997, the disclosure of which is hereby incorporated by reference herein.

BACKGROUND OF THE INVENTION

The present invention relates in general to an apparatus for testing microelectronic elements, and more particularly, to an interposer for testing microelectronic elements in the nature of bare printed circuits having a plurality of contacts arranged in matrices having normal and high contact pitch densities.

Electrical testing of microelectronic elements such as circuit elements and printed circuit boards, is typically conducted using drilled plates including dielectric materials. The drilled openings serve to guide spring loaded probes of the test fixture to test point locations which are of interest on the printed circuit. The probes may be either "hard" or permanently wired or they may be removable as is the case in systems where the text fixture is placed on a standard base grid of programmable test points.

FIG. 1 shows a printed circuit board 1 having a standard grid of test points 2 whereby all of the test probes 3 of the text fixture 4 are in alignment therewith. The system commonly uses "pogo pins" in a "bed-of-nails" configuration as shown. This system has reliably served the testing needs of the printed circuit industry for many years, however, at present there is a need to advance the state of the art to address two important issues: 1) the increasing density of test points associated with newer surface mount components, and 2) the need to translate grid points from a nominal 0.100" to grid pitches which may be either metric based or English based, often on the same circuit. It is the express purpose of this invention to address these needs by providing a low cost system for electrically testing local high contact pitch density areas of a printed circuit board. The system should be able to simultaneously test both high contact pitch density areas and normal contact pitch density areas on a circuit board.

FIG. 2 shows one system presently being used to test the high density areas of a printed circuit board. As is evident from FIG. 2, these fixtures are considerably complex. In order to contact the test points located in high density areas, some of the test probes 5 are angled toward one another so that the tops of the probes are closer together. However, this test system has additional cost in terms of both electronic and mechanical elements, and most of the test points will be unused most of the time.

Accordingly, there is an unsolved need for a test fixture which can accommodate microelectronic elements such as printed circuits and the like having contacts disposed thereon, for example, in both high contact pitch density and normal contact pitch density.

SUMMARY OF THE INVENTION

The present invention seeks to mitigate the major difficulties and inefficiencies of the above-described systems by providing for the customization of the circuit test fixture using lithographic techniques to produce a planar yet compliant test fixture rather than to use discrete test pins. The test fixture is formed using a flexible substrate. The circuit points for the test fixture are fabricated by any of a number of different mechanical techniques but would typically be formed by either electroforming, etching or a combination of the two. The actual test points are made compliant by backing the points with a compliant material. A resilient layer could also be included, such as a metal spring foil having shape memory characteristics to provide a restorative spring force for resilience. Spring foils can be super elastic materials such as certain nickel titanium alloys known as Nitinol®. The test fixture according to preferred embodiments of the present invention may be used in combination with existing test fixtures so that the test probes do not have to be angled to engage test points located in high density areas.

The "bed of nails" test fixtures described above typically utilize DC signals since they are less affected by the impedance added by the "Spring Pins" normally used in test fixtures; however, DC signals are of limited value when evaluating high frequency applications. However, when an AC signal is used, the spring in the probe looks like an inductor to the AC signal. It is possible to reduce the inductance by reducing the travel of the probe. Some test systems may also utilize a spring probe at the connection of the fixture to the tester. This method could also be obviated by using the approach described herein.

In accordance with one embodiment of the present invention there is disclosed an interposer for testing a microelectronic element having a plurality of contacts. The interposer includes a substrate having a top surface and a bottom surface, at least one conductive lead extending on the top surface between a first and second position, a first opening extending through the substrate from the bottom surface to a location on the top surface in communication with the conductive lead at the first position, the conductive lead at the second position registrable with one of the contacts on the microelectronic element, the opening operative for receiving a test probe therein for engagement with the conductive lead at the first position.

In accordance with another embodiment of the present invention there is disclosed an interposer for testing a microelectronic element having a plurality of contacts. The interposer includes a substrate having a top surface and a bottom surface, at least one conductive lead extending along one of the surfaces having a first end and a second end, a first layer overlying the bottom surface of the substrate having a first opening in alignment with the first end of the lead and a second opening spaced therefrom in alignment with an opening in the substrate extending between the top and bottom surfaces, the first opening operative for receiving a test probe therein for engagement with the first end of the lead for electrical connection to one of the contacts on the microelectronic element upon engagement therewith by the second end of the lead, the second opening operative for receiving a test probe therein for engagement with another one of the contacts on the microelectronic element.

In accordance with another embodiment of the present invention there is disclosed an interposer for testing a microelectronic element having a plurality of contacts. The interposer is arranged in a first and second matrix having different pitch densities, the interposer includes a substrate having a top surface and a bottom surface, a plurality of first openings extending through the substrate arranged in a matrix having a pitch density corresponding to the pitch density of the first matrix of the contacts, the first openings operative for receiving a plurality of test probes for engagement with a corresponding plurality of contacts on the microelectronic element, a plurality of conductive leads on one of the surfaces of the substrate, each lead having a first end and a second end, the second ends of the leads arranged in a matrix having a pitch density greater than the pitch density of the plurality of contacts within the first matrix, the second ends of the leads operative for engagement with the contacts on the microelectronic element arranged in a matrix having a pitch density corresponding to the pitch density of the second matrix of the contacts, a rigid layer overlying the bottom surface of the substrate and having a plurality of second openings in alignment with the first ends of the leads, the second openings operative for receiving a plurality of test probes for engagement with the first ends of the leads for electrical connection to the contacts in the second matrix on the microelectronic element, the rigid layer including a plurality of third openings in alignment with the plurality of the first openings within the substrate, the third openings operative for receiving a plurality of test probes therein for engagement with the contacts in the first matrix on the microelectronic element.

BRIEF DESCRIPTION OF THE DRAWINGS

The above description, as well as further objects, features and advantages of the present invention will be more fully understood with reference to the following detailed description of an apparatus for electrically testing bare printed circuits, when taken in conjunction with the accompanying drawings, wherein.

DETAILED DESCRIPTION OF THE PREFERRED EMBODIMENTS

Figure 1A:
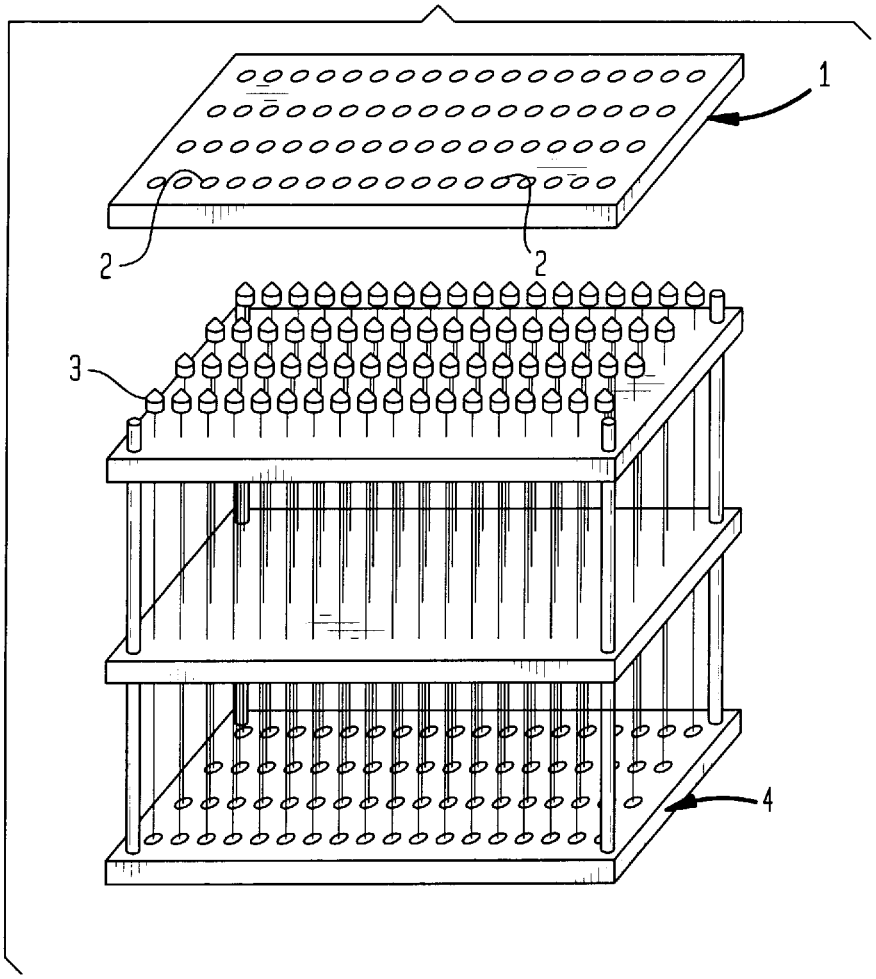
FIG. 1 is a diagrammatic illustration of a testing fixture in accordance with the prior art for contacts arranged in a normal pitch density.
Figure 1B:
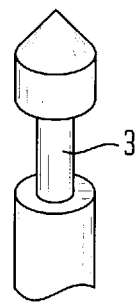
Figure 2:
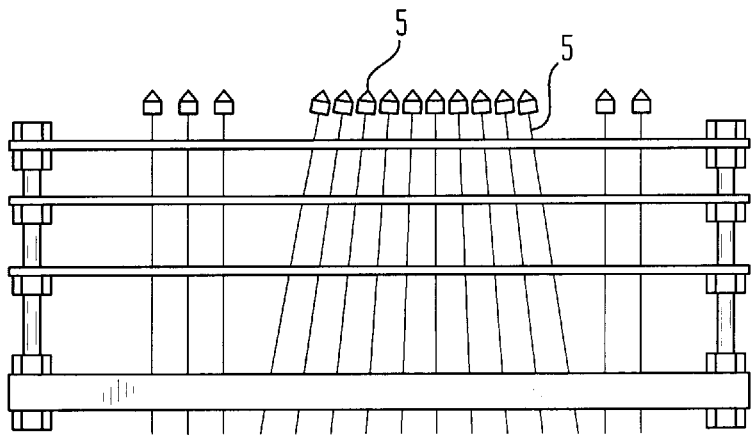
FIG. 2 is a diagrammatic illustration of a testing fixture in accordance with the prior art adapted for simultaneously testing both high contact pitch density areas and normal contact pitch density areas on a microelectronic element.
Figure 3A:
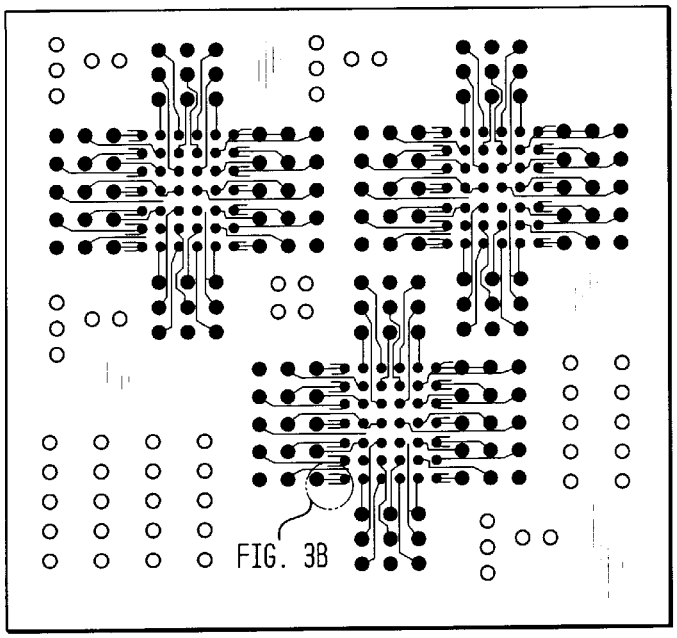
FIG. 3 is a top plan view of an interposer for testing a microelectronic element in the nature of a printed circuit board having a plurality of contacts thereon in accordance with one embodiment of the present invention.
Figure 3B:
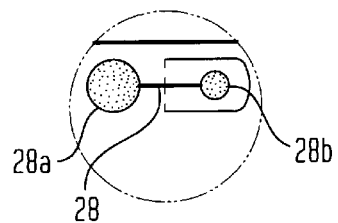
Figure 4:
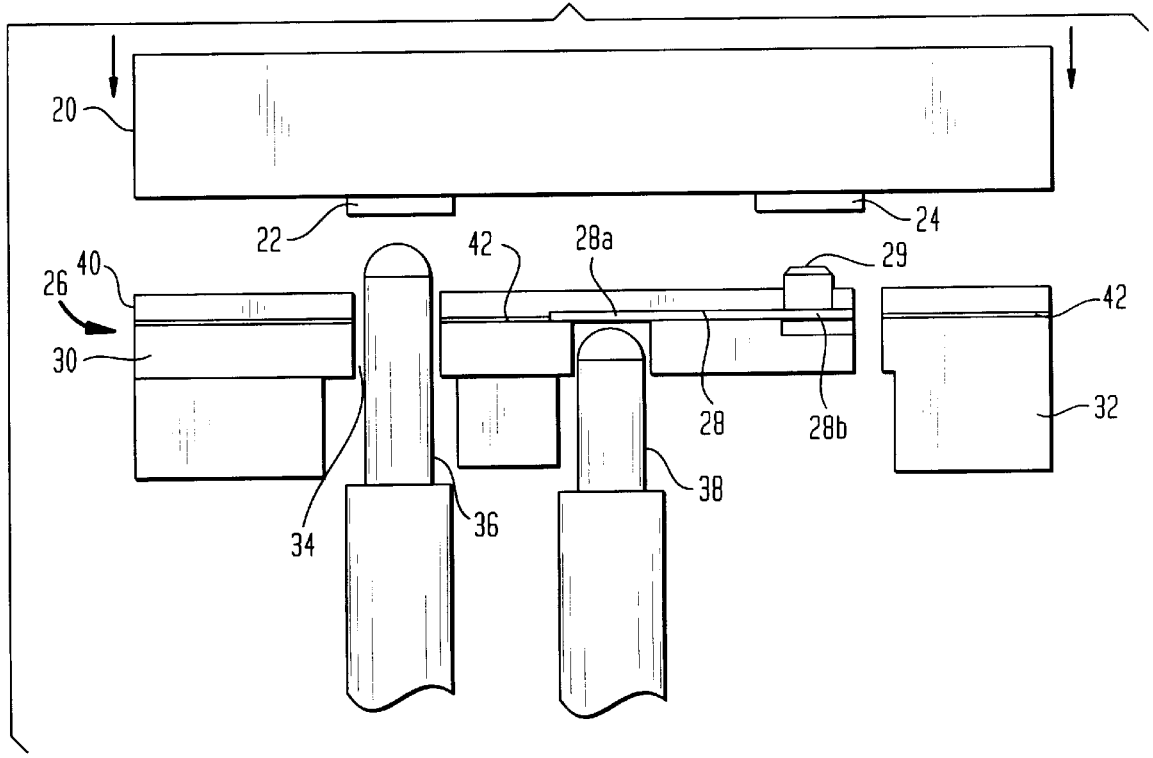
FIG. 4 is a side elevational view, in partial cross-section, of an interposer constructed in accordance with one embodiment of the present invention.

Referring to the drawings, wherein like reference numerals represent like elements, FIGS. 3 and 4 show respective top and fragmentary side views of a system for testing a microelectronic unit, such as a printed circuit board 20, according to one embodiment of the present invention. The printed circuit board (PCB) 20 includes first contacts 22 located in normal contact-to-contact ("contact pitch") density areas of the PCB 20 and second contacts 24 located in high contact pitch density areas of the PCB 20. The test system comprises an interposer having a flexible substrate 26 which includes a metallic layer 28, such as a copper layer, which is laminated, adhered or plated/sputtered to the top surface of a flexible layer 30, such as a polyimide film. A plurality of metallic conductive leads 28 are then formed using standard techniques such as photolithography and etching/plating techniques. The metallic conductors 28 interconnect certain test probes 38 and the contacts 24 located in high density areas of the PCB 20. The test system also includes a rigid layer 32 attached or adhered to the bottom of the flexible layer 30 for providing the interposer with a level of rigidity and to allow the interposer to more easily be aligned and juxtaposed with the PCB 20 and the test probes 36 and 38. The first "clearance holes" 34 are on a pitch which matches the test probes 36 having a standard pitch and the normal contact pitch density of the PCB 20. The clearance holes 34 are formed (as by punching, etching or laser ablating) through the flexible substrate 26 so that a first set of test probes 36 pass through the flexible substrate 26 and directly engage the contacts 22 located in normal contact-to-contact density areas of the PCB 20.

A second set of test probes 38 are used for testing the contacts 24 located in high contact pitch density areas of the PCB 20. The second set of test probes 38 do not directly engage the high density contacts 24. Instead, the second set of test probes 38 engage metallic conductive leads 28 through apertures in the flexible substrate 26. As shown in the magnified portion of FIG. 3, the metallic conductive leads 28 have a coarse end 28a which is engaged by test probe 38 and a tip end 28b which is capable of flexing relative to the coarse end 28a and the interposer. Typically, the tip end 28b of the lead 28 has a raised conductive portion 29 thereon for engaging the high density contacts 24. The areas around each metallic conductive lead 28 may be laser ablated or mechanically punched to provide for the individual displaceability of the tip end 28b of the lead 28 with respect to the coarse end 28a thereof. Asperities may also be provided to aid in the wiping of the tip end 28b against the high density contact 24, such as those described in U.S. Pat. No. 5,632,631, the disclosure of which is incorporated by reference herein.

A coverlay 40, such as a solder mask, may be laminated or deposited over the flexible layer 30 so that the metallic conductors 28 are disposed therebetween. In the particular embodiment shown in FIG. 4, the coverlay 40 is laminated to the flexible layer 30 using an adhesive 42; however, in the interest of clarity the thickness of the adhesive layer 42 shown in FIG. 4 has been greatly exaggerated and does not indicate the true scale of the adhesive layer 42 with respect to the other layers of the flexible substrate 26. The flexible substrate 26 may alternately have the conductive leads 28 on the surface of the substrate 26 facing the rigid board 32 which would obviate the need for the coverlay 40. In such an embodiment, an aperture in the flex substrate 26 would be needed to allow the raised conductive portion 29 and its corresponding substrate contact 24 to come into contact.

Figure 5:
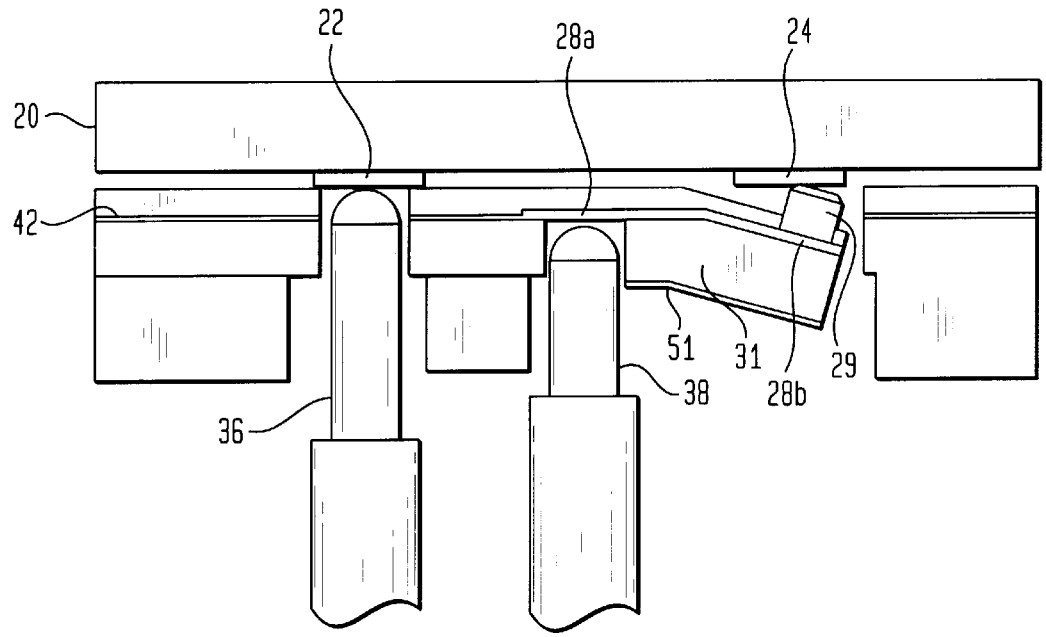
FIG. 5 is a side elevational view, in partial cross-section, showing the interposer of FIG. 4 engaging a plurality of contacts on a microelectronic element.

As shown in FIG. 5, during testing, the PCB 20 is lowered into engagement with the test fixture. First test probes 36 pass through clearance holes 34 in the interposer to engage contacts 22 located in normal contact pitch density areas of the PCB 20. Second test probes 38 engage the coarse ends 28a of the metallic leads 28 positioned for engaging contacts 24 located in high contact pitch density areas of the PCB 20. The metallic leads 28 are independently movable with respect to the interposer so that the tip ends 28b may be vertically displaced as a tongue 31 in response to engagement by the high density contacts 24, whereby the raised conductive portion 29 may wipe against the face of the contact 24 during testing.

Figure 6:
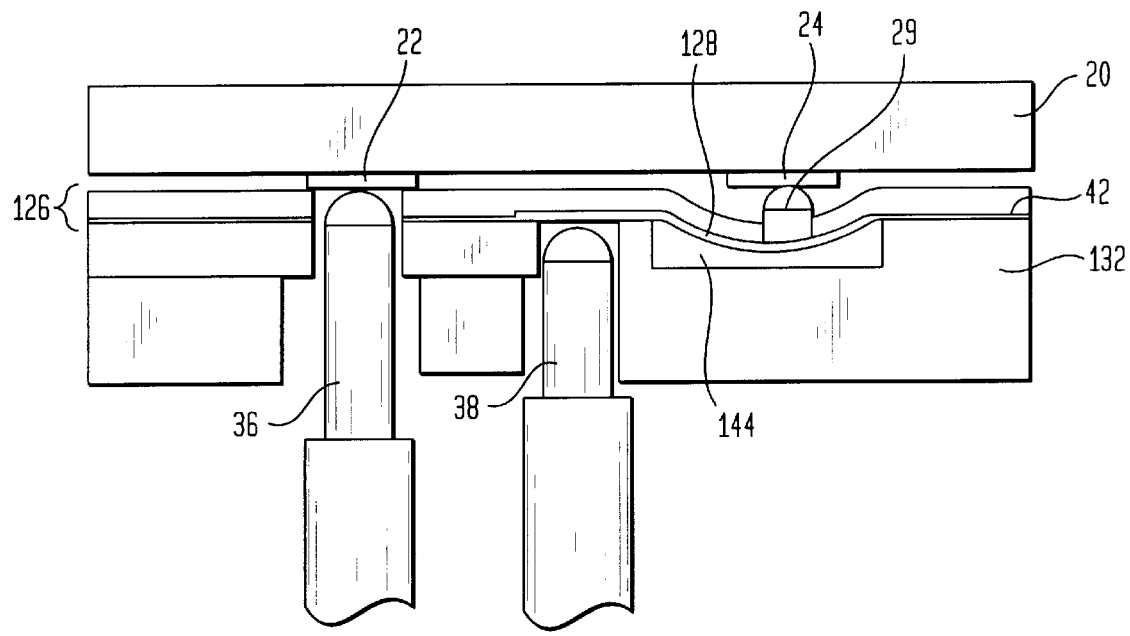
FIG. 6 is a side elevational view, in partial cross-section, of an interposer constructed in accordance with another embodiment of the present invention.

FIG. 6 shows another preferred embodiment of the present invention whereby portions of the flexible substrate 126 are attached to the rigid layer 132 using a compliant layer 144, whereby the compliant layer 144 bears upon and provides added resiliency for the deflecting metallic lead 128.

Further, where planar spring-like foils are provided on the back of the test structure, the back could serve as a ground to better control impedance of the substrate and to control electrical cross talk between the leads and the test ends, thereby allowing for the coarse measurement of electrical characteristics beyond simple shorts and opens test, e.g., the integration of impedance measurement along with the shorts and opens test. The leads 28 may be supported on one side of the interposer as shown in FIG. 5 with a spring-like foil 51, e.g., Nitinol®, to add resiliency to the tongue 31. The spring-like foil can also be employed in the interposer as shown in FIG. 6. In this regard, the spring-like foil could be placed on top of the interposer overlying the leads to provide similar resiliency to the leads when displaced into the compliant layer 144. Further, one or both surface(s) of the flexible substrate 26 may have at least portions thereon having power and/or ground planes to improve signal degradation which may be induced elsewhere in the test fixture assembly. This arrangement also allows for the coarse measurement of the electrical characteristics of the tested substrate 20 beyond a simple shorts and opens test.

Thus, the various embodiments of the present invention provide a reliable and economical system for testing printed circuit boards having contacts located in high density areas of the board. Although the invention herein has been described with reference to particular embodiments, it is to be understood that the embodiments are merely illustrative of the principles and application of the present invention. It is therefore to be understood that numerous modifications may be made to the embodiments and that other arrangements may be devised without departing from the spirit and scope of the present invention as defined by the claims.

What is claimed is:

1. An interposer for testing a microelectronic element having a plurality of contacts, said interposer comprising a substrate having a top surface and a bottom surface, at least one conductive lead extending on said top surface between a first and second position, a first opening extending through said substrate from said bottom surface to a location on said top surface in communication with said conductive lead at said first position, said conductive lead at said second position registrable with one of said contacts on said microelectronic element, said opening adapted for removable insertion of a test probe therein for engagement with said conductive lead at said first position.

2. The interposer of claim 1, wherein said substrate is flexible dielectric material.

3. The interposer of claim 1, further including a rigid layer overlying said bottom surface of said substrate and having an opening in alignment with said first opening in said substrate and underlying said second position.

4. The interposer of claim 3, wherein a portion of said substrate supporting said conductive lead at said second position is displaceable into said opening within said rigid layer.

5. The interposer of claim 1, further including a raised conductive body on said lead at said second position operative for engagement with one of said contacts on said microelectronic element.

6. The interposer of claim 5, wherein said raised conductive body includes at least one asperity thereon.

7. The interposer of claim 5, further including a dielectric layer overlying said top surface of said substrate and overlying said lead, said raised conductive body extending through said dielectric layer for engagement with one of said contacts on said microelectronic element.

8. The interposer of claim 7, further including an adhesive layer adhering said dielectric layer to said substrate and said lead.

9. The interposer of claim 1, further including a second opening extending through said substrate between said top and bottom surfaces, said second opening operative for receiving a test probe therethrough for engagement with another one of said contacts on said microelectronic element.

10. The interposer of claim 1, further including a rigid layer overlying said bottom surface of said substrate and having an opening in alignment with said second position, and a compliant layer between said rigid layer and said substrate within said opening within said rigid layer.

11. The interposer of claim 1, further including a plurality of first openings and a plurality of leads having a first end overlying a corresponding one of said first openings at said first position and a second end remote therefrom at said second position, the second ends of said leads arranged in a matrix having a first pitch density for engagement with a plurality of said contacts on said microelectronic element arranged in a matrix having a corresponding pitch density.

12. The interposer of claim 11, further including a plurality of second openings extending through said substrate arranged in a matrix having a second pitch density less than said first pitch density, said second openings operative for receiving a corresponding plurality of test probes for engagement with a corresponding plurality of contacts on said microelectronic element arranged in a matrix having a corresponding pitch density.

13. The interposer of claim 1, further including a spring-like layer on said bottom surface of said substrate underlying said lead.

14. An interposer for testing a microelectronic element having a plurality of contacts, said interposer comprising a substrate having a top surface and a bottom surface, at least one conductive lead extending along one of said surfaces having a first end and a second end, a first layer overlying said bottom surface of said substrate having a first opening in alignment with said first end of said lead and a second opening spaced therefrom in alignment with an opening in said substrate extending between said top and bottom surfaces, said first opening operative for receiving a test probe therein for engagement with said first end of said lead for electrical connection to one of said contacts on said microelectronic element upon engagement therewith by said second end of said lead, said second opening operative for receiving a test probe therein for engagement with another one of said contacts on said microelectronic element.

15. The interposer of claim 14, further including a compliant layer between said first layer and said bottom surface of said substrate underlying at least said second end of said lead, said compliant layer having an opening in alignment with said first opening and another opening in alignment with said second opening.

16. The interposer of claim 14, wherein said lead is arranged on said bottom surface of said substrate.

17. The interposer of claim 14, wherein said lead is arranged on said top surface of said substrate.

18. The interposer of claim 14, wherein said substrate is flexible dielectric material.

19. The interposer of claim 14, further including a body on said second end of said lead projecting above the top surface of said substrate.

20. The interposer of claim 19, wherein said body includes at least one asperity thereon.

21. The interposer of claim 19, further including a dielectric layer overlying said top surface of said substrate and overlying said lead, said body extending through said dielectric layer for engagement with one of said contacts on said microelectronic element.

22. The interposer of claim 21, further including an adhesive layer adhering said dielectric layer to said substrate and said lead.

23. The interposer of claim 14, wherein said first opening comprises one of a plurality of first openings arranged in a matrix having a first pitch density.

24. The interposer of claim 23, wherein said second opening comprises one of a plurality of second openings arranged in a matrix having a second pitch density, wherein said first pitch density is the same as said second pitch density.

25. The interposer of claim 14, further including a plurality of said first openings and a plurality of said leads each having a first end overlying a corresponding one of said openings and a second end remote therefrom, the second ends of said leads arranged in a matrix having a first pitch density for engagement with a plurality of contacts on said microelectronic element arranged in a matrix having a corresponding pitch density.

26. The interposer of claim 25, further including a plurality of said second openings in alignment with a corresponding number of said openings extending through said substrate, said second openings arranged in a matrix having a second pitch density less than said first pitch density, said second openings operative for receiving a corresponding plurality of test probes for engagement with a corresponding plurality of contacts on said microelectronic element arranged in a matrix having a corresponding pitch density.

27. The interposer of claim 14, further including a microelectronic element having a plurality of contacts thereon.

28. The interposer of claim 14, further including a spring-like layer on said bottom surface of said substrate underlying said lead.

29. An interposer for testing a microelectronic element having a plurality of contacts arranged in a first and second matrix having different pitch densities, said interposer comprising a substrate having a top surface and a bottom surface, a plurality of first openings extending through said substrate arranged in a matrix having a pitch density corresponding to the pitch density of said first matrix of said contacts, said first openings operative for receiving a plurality of test probes for engagement with a corresponding plurality of contacts on said microelectronic element, a plurality of conductive leads on one of said surfaces of said substrate, each said lead having a first end and a second end, said second ends of said leads arranged in a matrix having a pitch density greater than said pitch density of said plurality of contacts within said first matrix, said second ends of said leads operative for engagement with said contacts on said microelectronic element arranged in a matrix having a pitch density corresponding to said pitch density of said second matrix of said contacts, a rigid layer overlying said bottom surface of said substrate and having a plurality of second openings in alignment with said first ends of said leads, said second openings operative for receiving a plurality of test probes for engagement with said first ends of said leads for electrical connection to said contacts in said second matrix on said microelectronic element, said rigid layer including a plurality of third openings in alignment with said plurality of said first openings within said substrate, said third openings operative for receiving a plurality of test probes therein for engagement with said contacts in said first matrix on said microelectronic element.

30. The interposer of claim 29, wherein said substrate is flexible dielectric material.

31. The interposer of claim 29, further including a body on said second ends of said leads projecting above the top surface of said substrate.

32. The interposer of claim 29, further including a spring-like layer on said bottom surface of said substrate underlying said leads.

33. The interposer of claim 32, wherein said spring-like layer comprises shape memory material.

34. The interposer of claim 29, wherein said leads are disposed on the top surface of said substrate.

35. The interposer of claim 34, wherein a portion of said substrate and said rigid layer underlying said leads between said first and second ends forms a resilient flexible tongue.

36. The interposer of claim 29, further including a compliant layer between said bottom surface of said substrate and said rigid layer, said compliant layer having an opening in alignment with said second opening in said rigid layer and another opening in alignment with said third opening in said rigid layer.

37. The interposer of claim 1, wherein said first opening at said top surface is formed with a blind end by said at least one conductive lead.

* * * * *